(12) United States Patent
Han et al.

(10) Patent No.: US 10,255,985 B2
(45) Date of Patent: Apr. 9, 2019

(54) SUPPLEMENT RESETTING MODULE, GATE DRIVER CIRCUIT AND DISPLAY DEVICE

(71) Applicant: BOE TECHNOLOGY GROUP CO., LTD., Beijing (CN)

(72) Inventors: Mingfu Han, Beijing (CN);
Guangliang Shang, Beijing (CN);
Yuanbo Zhang, Beijing (CN); Yujie Gao, Beijing (CN); Yan Yan, Beijing (CN); Yingmeng Miao, Beijing (CN);
Seungwoo Han, Beijing (CN); Zhihe Jin, Beijing (CN); Xing Yao, Beijing (CN); Haoliang Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/503,830

(22) PCT Filed: Aug. 25, 2016

(86) PCT No.: PCT/CN2016/096719
§ 371 (c)(1),
(2) Date: Feb. 14, 2017

(87) PCT Pub. No.: WO2017/076111
PCT Pub. Date: May 11, 2017

(65) Prior Publication Data
US 2018/0233210 A1 Aug. 16, 2018

(30) Foreign Application Priority Data
Nov. 6, 2015 (CN) .......................... 2015 1 0752513

(51) Int. Cl.
*G11C 19/28* (2006.01)
*G09G 3/20* (2006.01)

(52) U.S. Cl.
CPC ............. *G11C 19/287* (2013.01); *G09G 3/20* (2013.01); *G11C 19/28* (2013.01); *G09G 2300/0426* (2013.01); *G09G 2310/0286* (2013.01)

(58) Field of Classification Search
CPC ....... G09G 3/20; G09G 3/3266; G09G 3/3677; G09G 3/3674; G11C 19/184; G11C 19/28
See application file for complete search history.

(56) References Cited

U.S. PATENT DOCUMENTS

2006/0221042 A1 10/2006 Cho et al.
2010/0007635 A1 1/2010 Kwon et al.
(Continued)

FOREIGN PATENT DOCUMENTS

CN 101625838 A 1/2010
CN 101727859 A 6/2010
(Continued)

OTHER PUBLICATIONS

International Search Report and Written Opinion for Application No. PCT/CN2016/096719, dated Nov. 22, 2016, 14 Pages.
(Continued)

*Primary Examiner* — Jennifer Mehmood
*Assistant Examiner* — James S Nokham
(74) *Attorney, Agent, or Firm* — Brooks Kushman P.C.

(57) ABSTRACT

A supplement resetting module for a gate driver circuit, including a pull-up control unit, a pull-down control unit, a clock signal input end, a predetermined level input end, a first control signal input end, a second control signal input end and a signal output end. A control end of the pull-up control unit is connected to the clock signal input end, an output end of the pull-up control unit is connected to the signal output end, a first control end of the pull-down control unit is connected to the first control signal input end, a
(Continued)

second control end of the pull-down control unit is connected to the second control signal input end, an input end of the pull-down control unit is connected to the predetermined level input end, and an output end of the pull-down control unit is connected to the signal output end.

15 Claims, 6 Drawing Sheets

(56) References Cited

U.S. PATENT DOCUMENTS

| | | | | |
|---|---|---|---|---|
| 2010/0013823 A1* | 1/2010 | Kwon | ............... | G09G 3/3674 |
| | | | | 345/214 |
| 2011/0012823 A1* | 1/2011 | Tsai | ............... | G09G 3/3677 |
| | | | | 345/100 |
| 2013/0028370 A1* | 1/2013 | Kikuchi | ............... | G09G 3/3677 |
| | | | | 377/64 |
| 2013/0088265 A1* | 4/2013 | Chen | ............... | H03K 5/153 |
| | | | | 327/108 |
| 2014/0055177 A1 | 2/2014 | Chen | | |
| 2014/0078124 A1* | 3/2014 | Chen | ............... | G09G 3/3266 |
| | | | | 345/205 |
| 2014/0177780 A1* | 6/2014 | Qi | ............... | G09G 3/20 |
| | | | | 377/64 |
| 2014/0192039 A1* | 7/2014 | Wang | ............... | G11C 19/28 |
| | | | | 345/213 |
| 2015/0062112 A1 | 3/2015 | Umezaki et al. | | |
| 2015/0279481 A1* | 10/2015 | Sasaki | ............... | G11C 19/184 |
| | | | | 377/69 |
| 2017/0010731 A1 | 1/2017 | Zhang et al. | | |
| 2017/0039987 A1 | 2/2017 | Yao et al. | | |

FOREIGN PATENT DOCUMENTS

| | | |
|---|---|---|
| CN | 102708778 A | 10/2012 |
| CN | 102789770 A | 11/2012 |
| CN | 202838908 U | 3/2013 |
| CN | 103035218 A | 4/2013 |
| CN | 103050077 A | 4/2013 |
| CN | 103943083 A | 7/2014 |
| CN | 104616618 A | 5/2015 |
| CN | 105245089 A | 1/2016 |
| CN | 205070772 U | 3/2016 |
| KR | 101192791 B1 | 10/2012 |
| KR | 20120111396 A | 10/2012 |

OTHER PUBLICATIONS

First Office Action for Chinese Application No. 201510752513.2, dated Jun. 9, 2017, 11 Pages.

* cited by examiner

SUPPLEMENT RESETTING MODULE, GATE DRIVER CIRCUIT AND DISPLAY DEVICE

CROSS-REFERENCE TO RELATED APPLICATION APPLICATIONS

This application is the U.S. national phase of PCT Application No. PCT/CN2016/096719 filed on Aug. 25, 2016, which claims priority to Chinese Patent Application No. 201510752513.2 filed on Nov. 6, 2015, the disclosures of which are incorporated in their entirety by reference herein.

TECHNICAL FIELD

The present disclosure relates to the field of display device, in particular to a supplement resetting module, a gate driver circuit including the supplement resetting module, and a display device including the gate driver circuit.

BACKGROUND

Usually, a gate driver circuit of a display device includes a plurality of shift register units connected in a cascaded manner, and the shift register unit at each level includes an pull-up node and an output end. In order to output a signal normally, it is necessary to reset the pull-up node and the output end after a scanning signal is outputted by a current-level shift register unit. In order to enhance a driving capability of the gate driver circuit and reduce a falling time, usually the pull-up node and the output end of each shift register unit are reset separately.

For the gate driver circuit, a resetting signal is applied by a next-level shift register unit to the current-level shift register unit, and the pull-up nodes and the output ends of the shift register units at the next levels are reset through a supplement resetting module. For the shift register units at the two adjacent levels, an output resetting end of a second-level shift register unit is usually connected to a pull-up node resetting end of a first-level shift register unit. In the case that the second-level shift register unit outputs a signal, a gate electrode (i.e., the output resetting end) of a pull-down transistor may be coupled to a high level due to the existence of a parasitic capacitance. Because the output resetting end of the second-level shift register unit is connected to the pull-up node resetting end of the first-level shift register unit, a potential at the pull-up node resetting end of the first-level shift register unit may be pulled up correspondingly. As a result, a leakage current may occur for the pull-up node of the first-level shift register unit.

Hence, in the case of resetting the current-level shift register unit, there is an urgent need to prevent the occurrence of leakage current for the pull-up node of the previous-level shift register unit.

SUMMARY

(1) Technical Problem to be Solved

An object of the present disclosure is to provide a supplement resetting module, a gate driver circuit including the supplement resetting module, and a display device including the gate driver circuit, so as to reset at least one of the shift register units at the last N levels through the supplement resetting module, thereby to prevent the occurrence of the leakage current for a pull-up node of the previous-level shift register unit corresponding to the shift register unit having the supplement resetting module.

(2) Technical Solution

In one aspect, the present disclosure provides in some embodiments a supplement resetting module for a gate driver circuit, including a pull-up control unit, a pull-down control unit, a clock signal input end, a predetermined level input end, a first control signal input end, a second control signal input end and a signal output end. A control end of the pull-up control unit is connected to the clock signal input end, an output end of the pull-up control unit is connected to the signal output end, and in the case of an effective signal is applied to the clock signal input end, the pull-up control unit is configured to enable the clock signal input end to be electrically connected to the signal output end. A first control end of the pull-down control unit is connected to the first control signal input end, a second control end of the pull-down control unit is connected to the second control signal input end, an input end of the pull-down control unit is connected to the predetermined level input end, an output end of the pull-down control unit is connected to the signal output end, and in the case that an effective signal is applied to any of the first control signal input end and the second control signal input end, the pull-down control unit is configured to enable the predetermined level input end to be electrically connected to the signal output end.

In a possible embodiment of the present disclosure, the pull-up control unit includes a pull-up control transistor, a gate electrode and a first electrode of which are connected to the clock signal input end to form the control end of the pull-up control unit, and a second electrode of which forms the output end of the pull-up control unit.

In a possible embodiment of the present disclosure, the pull-down control unit includes: a first pull-down control transistor, a gate electrode of which is connected to the first control signal input end, a first electrode of which is connected to the signal output end, and a second electrode of which is connected to the predetermined level input end; and a second pull-down control transistor, a gate electrode of which is connected to the second control signal input end, a first electrode of which is connected to the signal output end, and a second electrode of which is connected to the predetermined level input end.

In a possible embodiment of the present disclosure, in the case that the pull-up control unit includes the pull-up control transistor, a width-to-length ratio of the pull-up control transistor is smaller than a width-to-length ratio of the first pull-down control transistor and a width-to-length ratio of the second pull-down control transistor.

In another aspect, the present disclosure provides in some embodiments a gate driver circuit including multiple levels of shift register units and 2N clock signal lines. The shift register unit at each level includes an output resetting end and a pull-up node resetting end. The multiple levels of shift register units include display shift register units and resetting shift register units, and at least the shift register units at the latter N levels are the resetting shift register units, where N is a natural number greater than 0. Among at least the multiple levels of shift register units including the display shift register units and a first-level resetting shift register unit of the resetting shift register units at the latter N levels, an output resetting end of a current-level shift register unit is connected to a pull-up node resetting end of a previous-level shift register unit. The gate driver circuit further includes a first supplement resetting module, and at least the first-level resetting shift register unit of the resetting shift register units at the latter N levels corresponds to the first supplement resetting module. The first supplement resetting module includes a first pull-up control unit, a first pull-down control unit, a first clock signal input end, a predetermined level input end, a first control signal input end, a second control signal input end and a first signal output end. A control end of the first pull-up control unit is connected to the first clock signal input end, an output end of the first pull-up control unit is connected to the first signal output end, and in the case of an effective signal is applied to the first clock signal input end, the first pull-up control unit is configured to enable the first clock signal input end to be electrically connected to the first signal output end. A first control end of the first pull-down control unit is connected to the first control signal input end, a second control end of the first pull-down control unit is connected to the second control signal input end, an input end of the first pull-down control unit is connected to the predetermined level input end, an output end of the first pull-down control unit is connected to the first signal output end, and in the case that an effective signal is applied to any of the first control signal input end and the second control signal input end, the first pull-down control unit is configured to enable the predetermined level input end to be electrically connected to the first signal output end. The first control signal input end of the first supplement resetting module is connected to an input end of the resetting shift register unit corresponding to the first supplement resetting module, the second control signal input end of the first supplement resetting module is connected to an output end of the resetting shift register unit corresponding to the first supplement resetting module, and the first signal output end of the first supplement resetting module is connected to an output resetting end of the resetting shift register unit corresponding to the first supplement resetting module. In the case that an effective signal is outputted from the resetting shift register unit corresponding to the first supplement resetting module, a clock signal from the first clock signal input end of the first supplement resetting module is an ineffective signal.

In a possible embodiment of the present disclosure, each of the resetting shift register units at the latter N levels corresponds to one first supplement resetting module.

In a possible embodiment of the present disclosure, among the resetting shift register units at the latter N levels, apart from a first-level resetting shift register unit, the signal output end of each first supplement resetting module corresponding to a current-level resetting shift register unit is further connected to the pull-up node resetting end of the resetting shift register unit.

In a possible embodiment of the present disclosure, the gate driver circuit further includes a second supplement resetting module, and a last-level resetting shift register unit corresponds to the second supplement resetting module. The second supplement resetting module includes a second clock signal input end, a second pull-up control transistor, a third pull-down control transistor, a third control signal input end and a second signal output end. The second signal output end is connected to a pull-up node resetting node of the corresponding shift register unit. A gate electrode and a first electrode of the second pull-up control transistor are connected to the second clock signal input end, and a second electrode of the second pull-up control transistor is connected to the second signal output end. A gate electrode of the third pull-down control transistor is connected to the third control signal input end, and in the case that the resetting shift register unit corresponding to the second supplement resetting module starts to output an effective signal, the third control signal input end is configured to receive the effective signal. A first electrode of the third pull-down control transistor is connected to the second signal output end, and a second electrode of the third pull-down control transistor is connected to the predetermined level input end. For the first supplement resetting module and the second supplement resetting module corresponding to an identical resetting shift register unit, a clock signal from the second clock signal input end is staggered by a predetermined time period from a clock signal from the first clock signal input end, and the predetermined time period is smaller than a pulse width of an output signal from the shift register unit.

In a possible embodiment of the present disclosure, the signal output end of the first supplement resetting module is further connected to a pull-up node resetting end of a previous-level shift register unit of the resetting shift register unit corresponding to the first supplement resetting module.

In a possible embodiment of the present disclosure, the gate driver circuit further includes a third supplement resetting module, a structure of which is essentially identical to that of the first supplement resetting module. A clock signal from a first clock signal input end of the third supplement resetting module is staggered by a predetermined time period from a clock signal from a first clock signal input end of the first supplement resetting module, and the predetermined time period is smaller than a pulse width of an output signal from the shift register unit. In the case that the resetting shift register unit corresponding to the third supplement resetting module starts to output an effective signal, a first control signal input end of the third supplement resetting module is configured to receive the effective signal, and a second control signal input end of the third supplement resetting module is configured to receive a clock signal, a time sequence of which is complement to a time sequence of the clock signal from the first clock signal input end of the third supplement resetting module.

In a possible embodiment of the present disclosure, the first pull-up control unit includes a first pull-up control transistor, a gate electrode and a first electrode of which are connected to the clock signal input end to form the control end of the first pull-up control unit, and a second electrode of which forms the output end of the first pull-up control unit.

In a possible embodiment of the present disclosure, the first pull-down control unit includes: a first pull-down control transistor, a gate electrode of which is connected to the first control signal input end, a first electrode of which is connected to the signal output end, and a second electrode of which is connected to the predetermined level input end; and a second pull-down control transistor, a gate electrode of which is connected to the second control signal input end, a first electrode of which is connected to the signal output end, and a second electrode of which is connected to the predetermined level input end.

In a possible embodiment of the present disclosure, in the case that the first pull-up control unit includes the first pull-up control transistor, a width-to-length ratio of the first pull-up control transistor is smaller than a width-to-length ratio of the first pull-down control transistor and a width-to-length ratio of the second pull-down control transistor.

In a possible embodiment of the present disclosure, the shift register unit includes an output transistor, a first electrode of which is configured to receive a clock signal, and a second electrode of which is connected to an output end of the shift register unit, and a time sequence of the clock signal inputted to the first electrode of the output transistor corresponding to the shift register unit including the first supplement resetting module is supplement to a time sequence of the clock signal inputted to the first supplement resetting module.

In a possible embodiment of the present disclosure, N is 3.

In yet another aspect, the present disclosure provides in some embodiments a display device including the above-mentioned gate driver circuit.

(3) Beneficial Effect

According to the embodiments of the present disclosure, in the case that the current-level shift register unit outputs the signal, the ineffective signal is outputted by the supplement resetting module to the output resetting end of the current-level shift register unit, so as to completely turn off the pull-down control transistor, thereby to prevent the occurrence of a leakage current for a pull-up node of the previous-level shift register unit and output the signal normally.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

REFERENCE SIGN LIST

Figure 1:
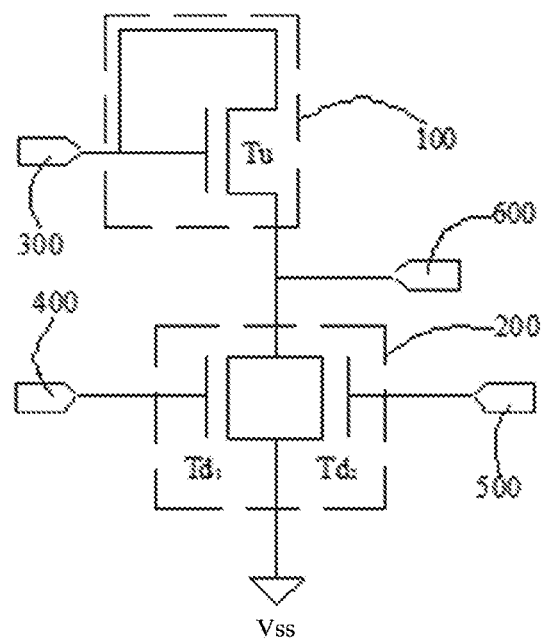
FIG. 1 is a schematic view showing a supplement resetting module according to one embodiment of the present disclosure.

100 pull-up control unit
200 pull-down control unit
300 clock signal input end
400 first control signal input end
500 second control signal input end
600 signal output end
700 second clock signal input end
800 third control signal input end
900 second signal output end

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the embodiments of the present disclosure, the so-called "effective signal" refers to a signal which is capable of turning on a TFT in the case of being applied to a gate electrode of the TFT, and the so-called "ineffective signal" refers to a signal which is incapable of turning on the TFT in the case of being applied to the gate electrode of the TFT. Types and values of the effective signal and the ineffective signal may depend on a type of the TFT that receives the effective signal and the ineffective signal. For example, in the case that the TFT is a P-type transistor, the effective signal is a low level signal, and the ineffective signal is a high level signal. In addition, in the case that the TFT is an N-type transistor, the ineffective signal is a low level signal, and the effective signal is a high level signal.

The present disclosure provides in some embodiments a supplement resetting module for a gate driver circuit. As shown in FIG. 1, the supplement resetting module includes a pull-up control unit 100, a pull-down control unit 200, a clock signal input end 300, a predetermined level input end Vss, a first control signal input end 400, a second control signal input end 500 and a signal output end 600.

A control end of the pull-up control unit 100 is connected to the clock signal input end 300, an output end of the pull-up control unit 100 is connected to the signal output end 600, and in the case of an effective signal is applied to the clock signal input end 300, the pull-up control unit 100 is configured to enable the clock signal input end 300 to be electrically connected to the signal output end 600.

A first control end of the pull-down control unit 200 is connected to the first control signal input end 400, a second control end of the pull-down control unit 200 is connected to the second control signal input end 500, an input end of the pull-down control unit 200 is connected to the predetermined level input end Vss, an output end of the pull-down control unit 200 is connected to the signal output end 600, and in the case that an effective signal is applied to any of the first control signal input end 400 and the second control signal input end 500, the pull-down control unit 200 is configured to enable the predetermined level input end Vss to be electrically connected to the signal output end 600.

Figure 2:
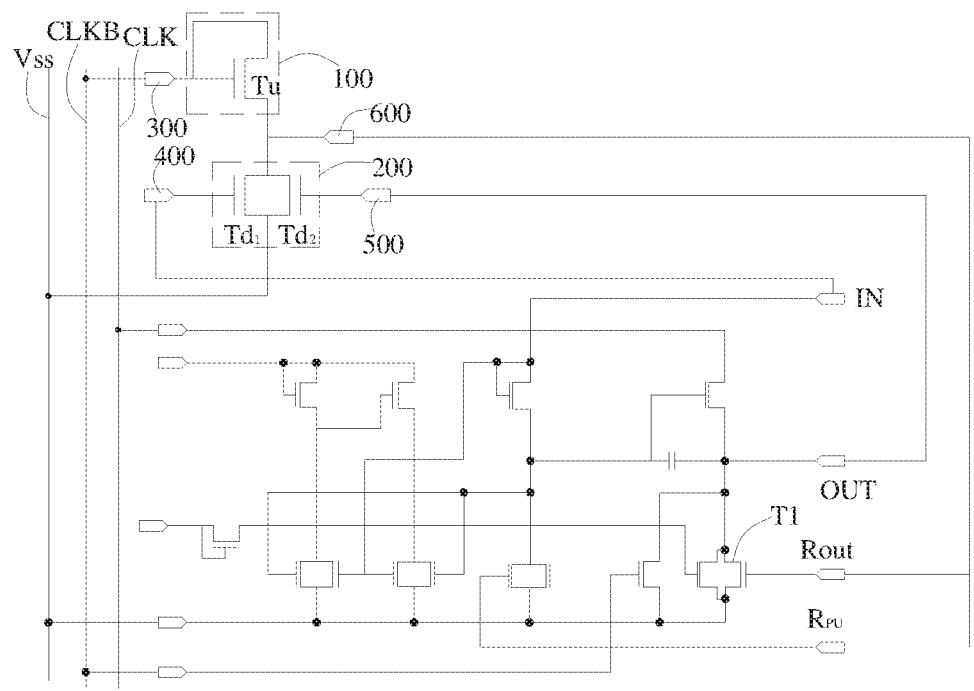
FIG. 2 is a schematic view showing a connection mode for the supplement resetting module and a shift register unit according to one embodiment of the present disclosure.

As shown in FIG. 2, the supplement resetting module is configured to reset a corresponding shift register unit. Hence, the signal output end 600 of the supplement resetting module may be connected to an output resetting end $R_{out}$ of the corresponding shift register unit (in FIG. 2, the signal output end 600 may be further connected to a pull-up node resetting end of a previous-level shift register unit (not shown)). The shift register unit includes an output pull-down transistor T1, a gate electrode of which is connected to the output resetting end $R_{out}$, a first electrode of which is connected to an output end OUT of the shift register unit, and a second electrode of which is connected to the predetermined level input end. The first control signal input end 400 and the second control signal input end 500 of the supplement resetting module are connected to an input end IN and the output end OUT of the corresponding shift register unit respectively.

It should be appreciated that, in the case that a high level signal is outputted by the shift register unit corresponding to the supplement resetting module, the clock signal from the clock signal input end 300 of the supplement resetting module is at a low level. In FIG. 2, a signal outputted by the shift register unit at an output stage is a clock signal applied to a clock signal line CLK. Hence, a time sequence of a clock signal applied to a clock signal line CLKB connected to the clock signal input end 300 of the supplement resetting module is complementary to a time sequence of the clock signal applied to the clock signal line CLK.

In the case that the effective signal is inputted to the shift register unit corresponding to the supplement resetting module, it is necessary to charge a storage capacitor and a pull-up node of the shift register unit. The first control signal input end 400 is also configured to receive the effective signal, so as to electrically connect the signal output end 600 of the supplement resetting module to the predetermined level input end Vss, thereby to enable the predetermined level input end Vss to output the ineffective signal. At this time, the ineffective signal is outputted by the supplement resetting module to a pull-up node resetting end $R_{PU}$ and the output resetting end $R_{out}$ of the corresponding shift register unit. The output pull-down transistor T1 and a pull-up node resetting transistor corresponding to the pull-up node resetting end $R_{PU}$ and the output resetting end $R_{out}$ are both in an off state, so that the pull-up node and the output end OUT of the shift register unit are not electrically connected to the predetermined level input end.

In the case that the effective signal is outputted by the output end OUT of the corresponding shift register unit, the second control signal input end 500 is configured to receive the effective signal, so as to electrically connect the signal output end 600 of the supplement resetting module to the predetermined level input end Vss. At this time, the ineffective signal is outputted by the supplement resetting module to the pull-up node resetting end $R_{PU}$ and the output resetting end $R_{out}$ of the corresponding shift register unit.

Figure 4:
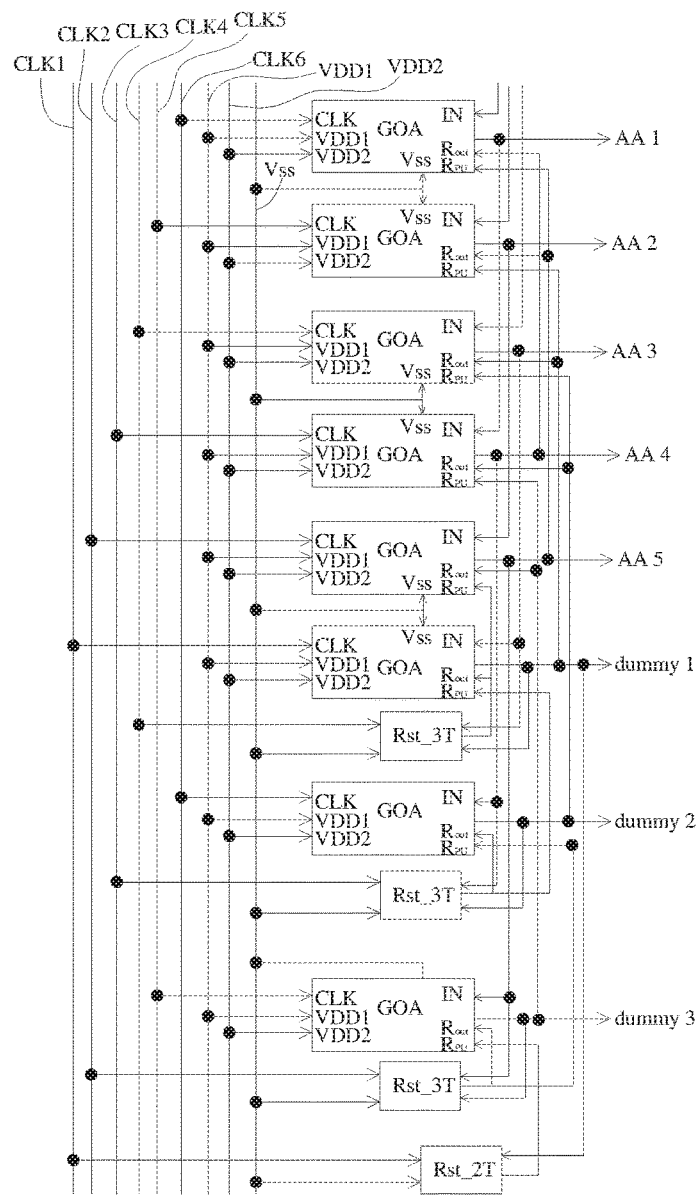
FIG. 4 is a schematic view showing a gate driver circuit according to one embodiment of the present disclosure.

As shown in FIG. 4, in the case that the shift register units are connected to each other in a cascaded manner, an output resetting end $R_{out}$ of a current-level shift register unit is connected to a pull-up node resetting end $R_{PU}$ of a previous-level shift register unit.

In the embodiments of the present disclosure, in the case that a signal is outputted by the current-level shift register unit, the ineffective signal is outputted by the supplement resetting module to the output resetting end $R_{out}$ of the current-level shift register unit, so as to completely turn off the pull-down control transistor T1, thereby to prevent the occurrence of a leakage current for the pull-up node of the previous-level shift register unit and output the signal normally.

In the case that the signal outputted by the corresponding shift register unit is switched from the effective signal to the ineffective signal, the effective signal is applied to the clock signal input end 300 of the supplement resetting module. After the clock signal input end 300 of the supplement resetting module has received the effective signal, the effective signal may be outputted by the supplement resetting module to the output resetting end and the pull-up node resetting end of the corresponding shift register unit, so as to reset the pull-up node and the output end of the corresponding shift register unit separately.

In a possible embodiment of the present disclosure, as shown in FIG. 1, the pull-up control unit 100 may include a pull-up control transistor Tu, a gate electrode and a first electrode of which are connected to the clock signal input end 300 to form the control end of the pull-up control unit 100, and a second electrode of which forms the output end of the pull-up control unit 100. In other words, the second electrode of the pull-up control transistor Tu is connected to the signal output end 600.

In the case that the clock signal input end 300 has received the effective signal, the pull-up control transistor Tu may be turned on, so as to output the effective signal from the clock signal input end 300 to the signal output end.

In a possible embodiment of the present disclosure, as shown in FIG. 1, the pull-down control unit 200 includes: a first pull-down control transistor $Td_1$, a gate electrode of which is connected to the first control signal input end 400, a first electrode of which is connected to the signal output end 600, and a second electrode of which is connected to the predetermined level input end Vss; and a second pull-down control transistor $Td_2$, a gate electrode of which is connected to the second control signal input end 500, a first electrode of which is connected to the signal output end 600, and a second electrode of which is connected to the predetermined level input end Vss.

In the case that the gate electrode of the first pull-down control transistor $Td_1$ has received the effective signal, the first pull-down control transistor $Td_1$ may be turned on, so as to electrically connect the signal output end 600 to the predetermined level input end Vss, thereby to enable a potential at the signal output end 600 to be identical to the signal from the predetermined level input end Vss.

In the case that the gate electrode of the second pull-down control transistor $Td_2$ has received the effective signal, the second pull-down control transistor $Td_2$ may be turned on, so as to electrically connect the signal output end 600 to the predetermined level input end Vss, thereby to enable the potential at the signal output end 600 to be identical to the signal from the predetermined level input end Vss.

In a possible embodiment of the present disclosure, in the case that the pull-up control unit 100 includes the pull-up control transistor Tu, a width-to-length ratio of the pull-up control transistor Tu is smaller than a width-to-length ratio of the first pull-down control transistor $Td_1$ and a width-to-length ratio of the second pull-down control transistor $Td_2$. In this way, in the case that the pull-down control unit 200 has received the effective signal, it is able to ensure that the supplement resetting module can output the signal approximate to or equal to a predetermined level signal no matter whether the pull-up control transistor Tu is turned on or not.

For example, the width-to-length ratio of the pull-up control transistor Tu may be 100u/5u, and the width-to-length ratios of the first pull-down control transistor $Td_1$ and the second pull-down control transistor $Td_2$ may be each 800u/5u.

The present disclosure further provides in some embodiments a gate driver circuit including the supplement resetting module. As shown in FIG. 4, in another aspect, the present disclosure provides in some embodiments a gate driver circuit including multiple levels of shift register units and 2N clock signal lines. The shift register unit at each level includes an output resetting end $R_{out}$ and a pull-up node resetting end $R_{PU}$. Depending on different functions of the output signals, the multiple levels of shift register units include display shift register units and resetting shift register units, and at least the shift register units at the latter N levels are the resetting shift register units, where N is a natural number greater than 0. Among at least the multiple levels of shift register units including the display shift register units and a first-level resetting shift register unit of the resetting shift register units at the latter N levels, an output resetting end of a current-level shift register unit is connected to a pull-up node resetting end of a previous-level shift register unit. The gate driver circuit further includes a first supplement resetting module Rst_3T, which is just the above-mentioned supplement resetting module. At least the first-level resetting shift register unit of the resetting shift register units at the latter N levels corresponds to one first supplement resetting module.

In the case that N is a natural number greater than 1, the time periods for outputting the effective signals by the two adjacent levels of shift register units are not completely staggered from each other, and instead, they partially overlap each other.

In the case that the two adjacent levels of shift register units output the effective signal simultaneously, a first level signal may be outputted by the first supplement resetting module Rs_3T to an output resetting end of a next-level shift register unit. This first level signal is ineffective with respect to an output pull-down transistor of the next-level shift register unit. At this time, the output pull-down transistor of the next-level shift register unit is turned off, and a gate electrode thereof and a pull-up node resetting end of a previous-level shift register unit receive the ineffective signal. Hence, a pull-up node of the previous-level shift register unit may not be discharged, so as to enable the previous-level shift register unit to output the effective signal in a stable manner.

It should be appreciated that, the resetting shift register units at the latter N levels merely function as to provide a resetting signal, rather than a scanning signal for display.

To be specific, the first supplement resetting module Rst_3T includes a first pull-up control unit, a first pull-down control unit, a first clock signal input end, a predetermined level input end Vss, a first control signal input end, a second control signal input end and a first signal output end.

A control end of the first pull-up control unit is connected to the first clock signal input end, an output end of the first pull-up control unit is connected to the first signal output end of the first supplement resetting module Rst_3T, and in the case of the effective signal is applied to the first clock signal input end, the first pull-up control unit is configured to enable the first clock signal input end to be electrically connected to the first signal output end.

A first control end of the first pull-down control unit is connected to the first control signal input end, a second control end of the first pull-down control unit is connected to the second control signal input end, an input end of the first pull-down control unit is connected to the predetermined level input end Vss, an output end of the first pull-down control unit is connected to the first signal output end, and in the case that an effective signal is applied to any of the first control signal input end and the second control signal input end, the first pull-down control unit is configured to enable the predetermined level input end Vss to be electrically connected to the first signal output end.

The first control signal input end of the first supplement resetting module Rst_3T is connected to an input end of the resetting shift register unit corresponding to the first supplement resetting module Rst_3T, the second control signal input end of the first supplement resetting module is connected to an output end of the resetting shift register unit corresponding to the first supplement resetting module Rst_3T, and the first signal output end of the first supplement resetting module Rst_3T is connected to an output resetting end $R_{out}$ of the resetting shift register unit corresponding to the first supplement resetting module.

In the case that an effective signal is outputted from the resetting shift register unit corresponding to the first supplement resetting module Rst_3T, a clock signal from the first clock signal input end of the first supplement resetting module Rst_3T is an ineffective signal.

The gate driver circuit in the embodiments of the present disclosure will be described hereinafter in the case that the effective signal is a high level signal and the ineffective signal is a low level signal. Here, a predetermined level signal from the predetermined level signal input end Vss is a low level signal.

As shown in FIGS. 4 and 6-8, N is 3. In FIG. 4, the resetting shift register units at the latter three levels include a resetting shift register unit for outputting a signal dummy1, a resetting shift register unit for outputting a signal dummy2, and a resetting shift register unit for outputting a signal dummy3. Hence, the resetting shift register unit for outputting the signal dummy1 is just a first-level resetting shift register unit for the resetting shift register units at the latter three levels, and at least the resetting shift register unit for outputting the signal dummy1 corresponds to one first supplement resetting module.

Figure 6:
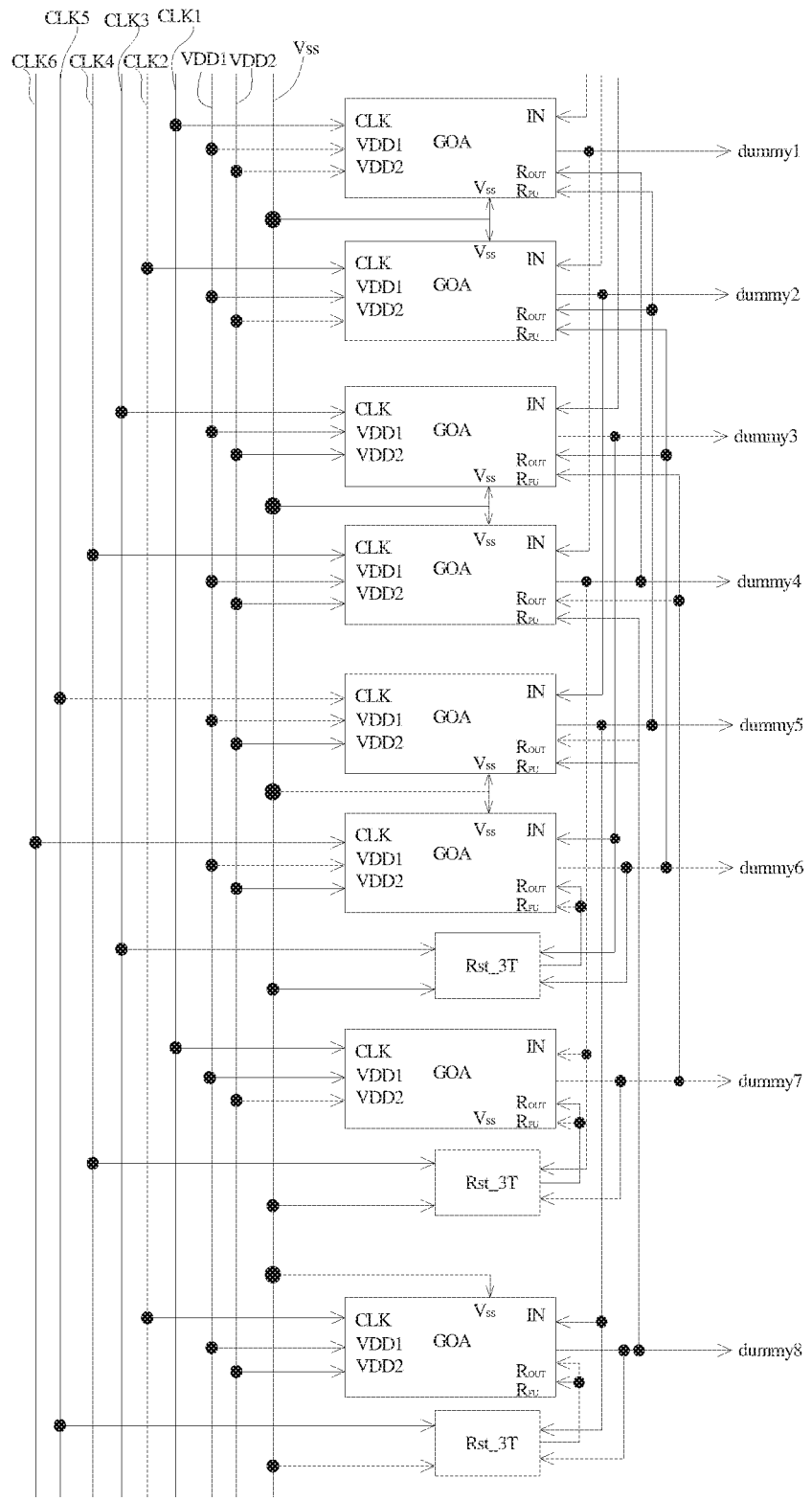
FIG. 6 is another schematic view showing the gate driver circuit according to one embodiment of the present disclosure.
Figure 7:
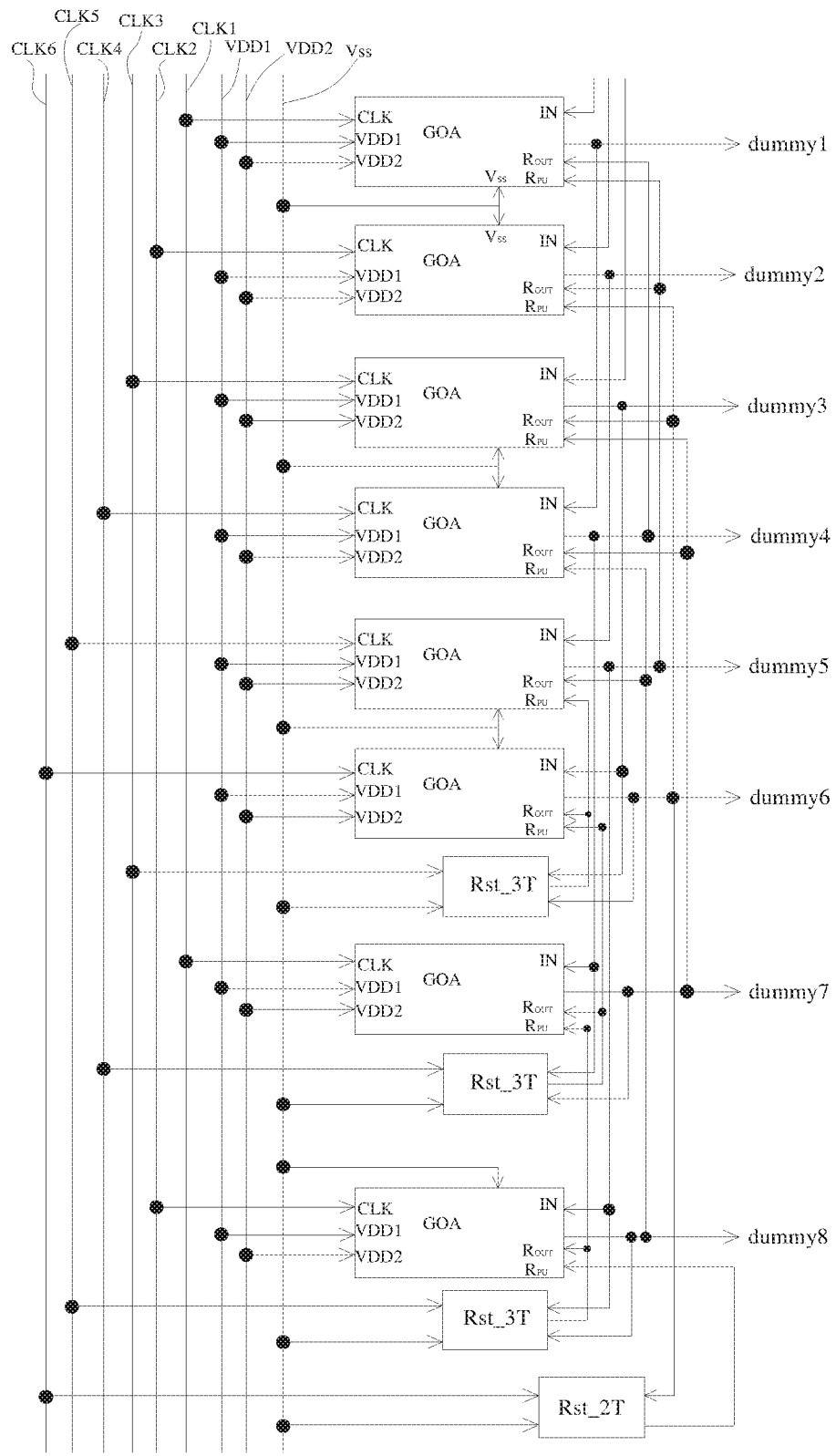
FIG. 7 is yet another schematic view showing the gate driver circuit according to one embodiment of the present disclosure.
Figure 8:
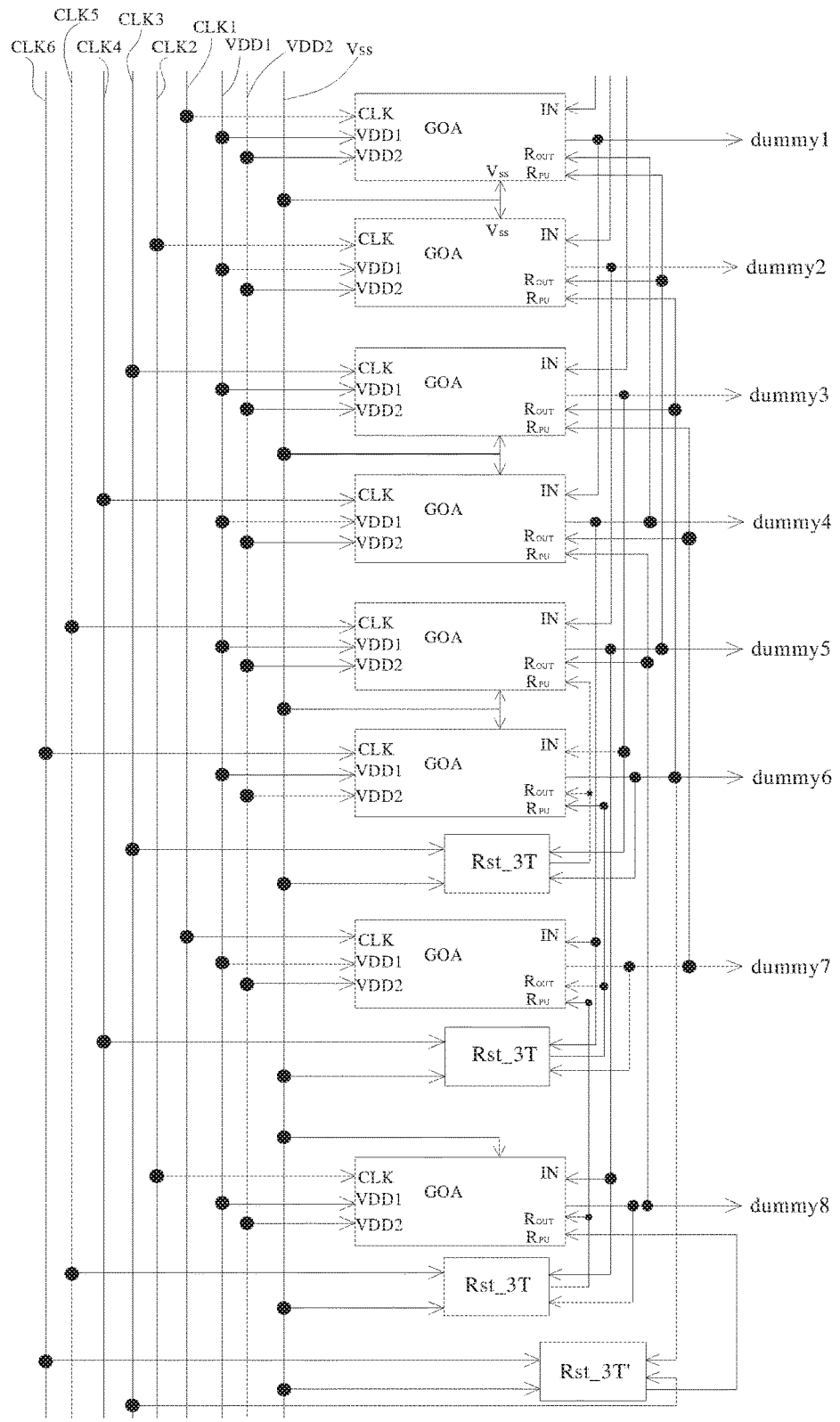
FIG. 8 is still yet another schematic view showing the gate driver circuit according to one embodiment of the present disclosure.

In FIGS. 6-8, the resetting shift register units at the latter three levels include a resetting shift register unit for outputting a signal dummy6, a resetting shift register unit for outputting a signal dummy1, and a resetting shift register unit for outputting a signal dummy8. Hence, the resetting shift register unit for outputting the signal dummy6 is just a first-level resetting shift register unit for the resetting shift register units at the latter three levels, and at least the resetting shift register unit for outputting the signal dummy6 corresponds to one first supplement resetting module.

Figure 5:
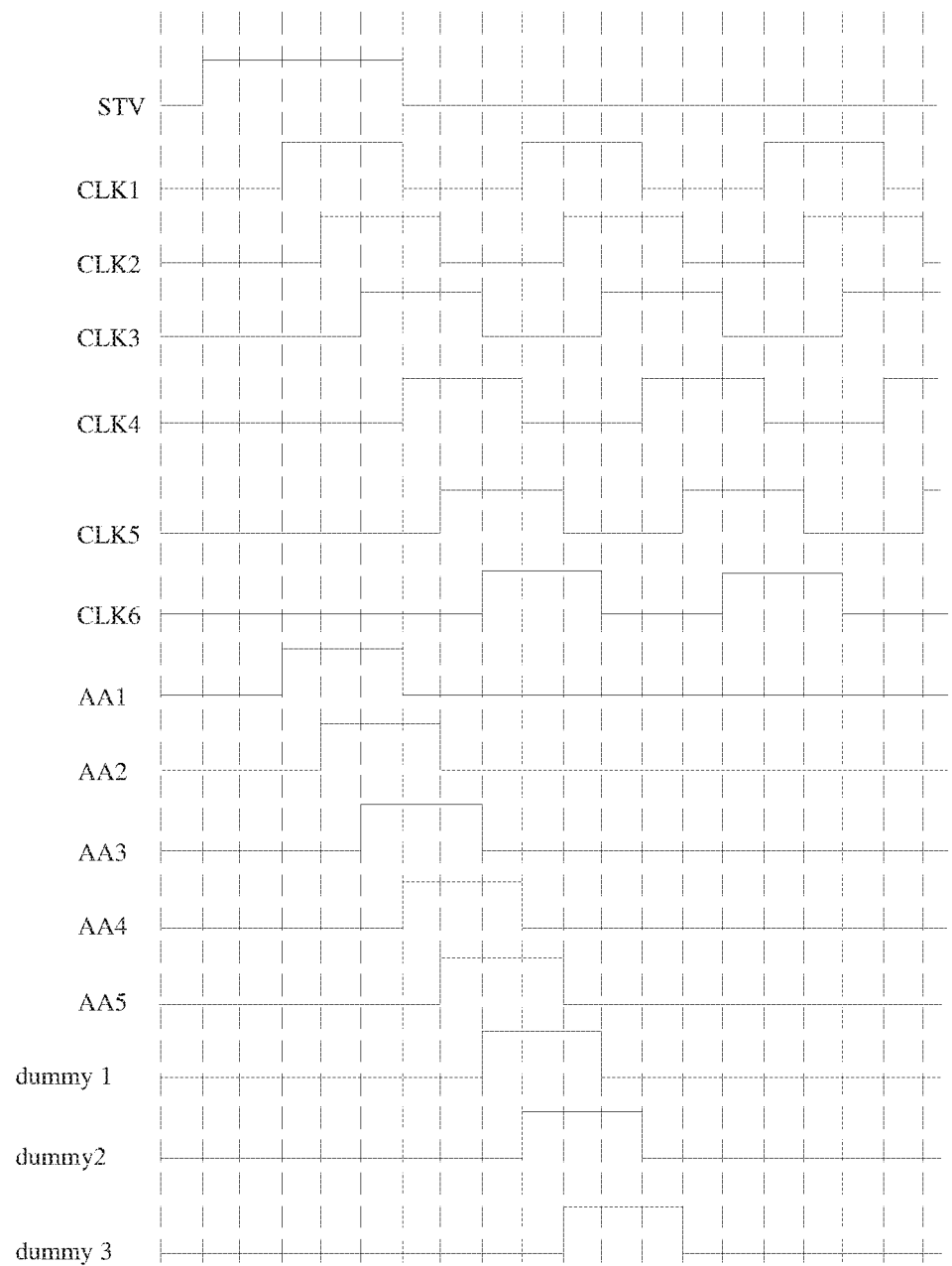
FIG. 5 is a sequence diagram of signals for the gate driver circuit in FIG. 4.

As shown in FIG. 4, a resetting output end $R_{out}$ of the resetting shift register unit for outputting the signal dummy1 is connected to a pull-up node resetting node $R_{PU}$ of a shift register unit for outputting a signal AA5. As shown in FIG. 5, in the case that the resetting shift register unit for outputting the signal dummy1 starts to output a high level signal, the shift register unit for outputting the signal AA5 still outputs a high level signal. At this time, it is necessary to ensure that no leakage current occurs for a pull-up node of the shift register unit for outputting the signal AA5, so as to ensure that the signal AA5 is maintained at a high level.

In the case that that the resetting shift register unit for outputting the signal dummy1 starts to output the high level signal, the clock signal from the first clock signal input end is at a low level, and the gate electrode of the first pull-down control transistor is at a low level too, so the first pull-down control transistor may be turned off. At the same time, the second pull-down control transistor is turned on, so as to electrically connect the first signal output end to the predetermined level signal input end Vss and enable the first signal output end to output a low level signal to the resetting output end $R_{out}$ of the resetting shift register unit for outputting the signal dummy1, thereby to turn off the output pull-down transistor corresponding to the resetting output end $R_{out}$. Correspondingly, the pull-up node resetting end $R_{PU}$ of the shift register unit for outputting the signal AA5 may be maintained at a low level, so as to prevent the occurrence of the leakage current for the pull-up node of the shift register unit for outputting the signal AA5, thereby to maintain the signal AA5 at a high level.

The signal AA5 is a scanning signal for display, so it is able for the gate driver circuit in the embodiments of the present disclosure to provide the scanning signal in a stable manner.

As mentioned above, at least the first-level resetting shift register unit of the resetting shift register units at the latter N levels corresponds to the first supplement resetting module Rst_3T, i.e., the other shift register units may also correspond to the first supplement resetting module Rst_3T. The other resetting shift register units of the resetting shift register units at the latter N levels may also correspond to the supplement resetting module of any other structure, or correspond to the first supplement resetting module.

In a possible embodiment of the present disclosure, each resetting shift register unit of the resetting shift register units at the latter N levels may correspond to one first supplement resetting module. As shown in FIG. 4, the resetting shift register unit for outputting the signal dummy2 and the resetting shift register unit for outputting the signal dummy3 each correspond to the first supplement resetting module Rst_3T.

In a possible embodiment of the present disclosure, as shown in FIG. 6, among the resetting shift register units at the latter N levels, apart from the first-level resetting shift register unit (i.e., the resetting shift register unit for outputting the signal dummy6), the signal output end of the first supplement resetting module corresponding to each of the other resetting shift register units is further connected to the pull-up node resetting end of the corresponding resetting shift register unit.

In another possible embodiment of the present disclosure, the gate driver circuit further includes a second supplement resetting module Rst_2T. As shown in FIG. 4, a last-level resetting shift register unit corresponds to one second supplement resetting module Rst_2T.

Figure 3:
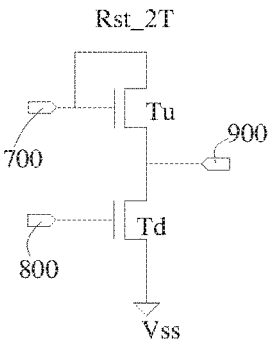
FIG. 3 is a schematic view showing a second supplement resetting module according to one embodiment of the present disclosure.

As shown in FIG. 3, the second supplement resetting module Rst_2T includes a second clock signal input end 700, a second pull-up control transistor Tu, a third pull-down control transistor Td, a third control signal input end 800 and a second signal output end 900.

As shown in FIG. 4, the second signal output end is connected to the pull-up node resetting end $R_{PU}$ of the corresponding resetting shift register unit (i.e., the last-level shift register unit).

A structure of the second supplement resetting module Rst_2T will be described hereinafter with reference to FIG. 3. As shown in FIG. 3, a gate electrode and a first electrode of the second pull-up control transistor Tu are connected to the second clock signal input end 700, and a second electrode of the second pull-up control transistor Tu is connected to the second signal output end 900. A gate electrode of the third pull-down control transistor Td is connected to the third control signal input end 800, and in the case that the resetting shift register unit corresponding to the second supplement resetting module Rst_2T starts to output an effective signal, the third control signal input end 800 is configured to receive the effective signal. A first electrode of the third pull-down control transistor Td is connected to the second signal output end 900, and a second electrode of the third pull-down control transistor Td is connected to the predetermined level input end Vss.

For the first supplement resetting module Rst_3T and the second supplement resetting module Rst_2T corresponding to an identical resetting shift register unit, a clock signal from the second clock signal input end is staggered by a predetermined time period from a clock signal from the first clock signal input end, and the predetermined time period is smaller than a pulse width of an output signal from the shift register unit. In other words, the first supplement resetting module Rst_3T and the second supplement resetting module Rst_2T corresponding to an identical resetting shift register unit are connected to different clock signal lines respectively.

The second supplement resetting module Rst_2T is configured to output a signal to the pull-up node resetting end $R_{PU}$ of the corresponding shift register unit, so as to reset the pull-up node of the corresponding shift register unit.

In a possible embodiment of the present disclosure, as shown in FIGS. 7 and 8, the signal output end of the first supplement resetting module Rst_3T is further connected to a pull-up node resetting end $R_{PU}$ of a previous-level shift register unit (a resetting shift register unit or a display shift register unit) of the resetting shift register unit corresponding to the first supplement resetting module Rst_3T.

In a possible embodiment of the present disclosure, as shown in FIG. 8, the gate driver circuit further includes a third supplement resetting module Rst_3T', a structure of which is essentially identical to that of the first supplement resetting module Rst_3T. A clock signal from a first clock signal input end of the third supplement resetting module Rst_3T' is staggered by a predetermined time period from a clock signal from a first clock signal input end of the first supplement resetting module Rst_3T, and the predetermined time period is smaller than a pulse width of an output signal from the shift register unit. In the case that the resetting shift register unit corresponding to the third supplement resetting module starts to output an effective signal, a first control signal input end of the third supplement resetting module is configured to receive the effective signal, and a second control signal input end of the third supplement resetting module is configured to receive a clock signal, a time sequence of the clock signal is supplement to a time sequence of the clock signal from the first clock signal input end of the third supplement resetting module.

The clock signal is applied to the second control signal input end of the third supplement resetting module, so a potential at the signal output end of the third supplement resetting module may be pulled down alternately, so as to prevent the aging of the gate electrode of the second pull-down control transistor connected to the signal output end of the third supplement resetting module, thereby to prolong a service life of the third supplement resetting module.

In a possible embodiment of the present disclosure, the first pull-up control unit includes a first pull-up control transistor, a gate electrode and a first electrode of which are connected to the first clock signal input end to form the control end of the first pull-up control unit, and a second electrode of which forms the output end of the first pull-up control unit.

In a possible embodiment of the present disclosure, the first pull-down control unit includes: a first pull-down control transistor, a gate electrode of which is connected to the first control signal input end, a first electrode of which is connected to the signal output end, and a second electrode of which is connected to the predetermined level input end; and a second pull-down control transistor, a gate electrode of which is connected to the second control signal input end, a first electrode of which is connected to the signal output end, and a second electrode of which is connected to the predetermined level input end.

In a possible embodiment of the present disclosure, in the case that the first pull-up control unit includes the first pull-up control transistor, a width-to-length ratio of the first pull-up control transistor is smaller than a width-to-length ratio of the first pull-down control transistor and smaller than a width-to-length ratio of the second pull-down control transistor.

In order to acquire a better display effect, each of the resetting shift register units at the latter N levels may correspond to the first supplement resetting module.

As shown in FIG. 4, the shift register units at the latter N levels are the resetting shift register units, and the other shift register units are the display shift register units. In other words, the signal from each of the shift register units at the latter N levels is merely used to reset the pull-up node and the output end of the display shift register unit corresponding thereto.

As shown in FIGS. 6-8, the gate driver circuit includes more than N resetting shift register units, i.e., the resetting shift register units at the latter N levels are merely used to reset the preceding resetting shift register units. Through more than N resetting shift register units, it is able to effectively prevent the occurrence of the leakage current for the pull-up node of the display shift register unit, thereby to output the scanning signal in a stable manner. Each of the resetting shift register units at the latter N levels corresponds to the first supplement resetting module. Hence, it is able to prevent the occurrence of the leakage current for the pull-up node of the other resetting shift register unit connected to the resetting shift register units at the latter N levels, thereby to output the resetting signal in a stable manner and enable the display shift register unit to output the scanning signal in a stable manner.

In a possible embodiment of the present disclosure, the shift register unit corresponding to the first supplement resetting module includes an output transistor, a first electrode of which is configured to receive a clock signal, and a second electrode of which is connected to an output end of the shift register unit, and a time sequence of the clock signal inputted to the first electrode of the output transistor corresponding to the shift register unit including the first supplement resetting module is complement to a time sequence of the clock signal inputted to the first supplement resetting module.

In a possible embodiment of the present disclosure, N is 3.

In the case that N is 3, the gate driver circuit includes six clock signal lines, i.e., a clock signal line CLK1, a clock signal line CLK2, a clock signal line CLK3, a clock signal line CLK4, a clock signal line CLK5 and a clock signal line CLK6. The signals from the adjacent two clock signal lines are staggered from each other by a predetermined time period. A time sequence of the signal from the clock signal line CLK1 is complement to a time sequence of the signal from the clock signal line CLK4, a time sequence of the signal from the clock signal line CLK2 is complement to a time sequence of the signal from the clock signal line CLK5, and a time sequence of the signal from the clock signal line CLK3 is complement to a time sequence of the signal from the clock signal line CLK6.

As shown in FIG. 4, the shift register units at the latter 3 levels include a resetting shift register unit for outputting a signal dummy1, a resetting shift register unit for outputting a signal dummy2 and a resetting shift register unit for outputting a signal dummy3.

The resetting shift register unit for outputting the signal dummy1 is connected to the clock signal line CLK1, and the first supplement resetting module Rst_3T corresponding to the resetting shift register unit for outputting the signal dummy1 is connected to the clock signal line CLK4. The resetting shift register unit for outputting the signal dummy2 is connected to the clock signal line CLK6, and the first supplement resetting module Rst_3T corresponding to the resetting shift register unit for outputting the signal dummy2 is connected to the clock signal line CLK3. The resetting shift register unit for outputting the signal dummy3 is connected to the clock signal line CLK5, and the first supplement resetting module Rst_3T corresponding to the resetting shift register unit for outputting the signal dummy3 is connected to the clock signal line CLK2.

As shown in FIG. 4, a predetermined level applied by a predetermined level signal line is a low level. The output resetting end of the resetting shift register unit for outputting the signal dummy3 is connected to the signal output end of the corresponding first supplement resetting module Rst_3T, and the pull-up node resetting end $R_{PU}$ of the resetting shift register unit for outputting the signal dummy3 is connected to the signal output end of the corresponding second supplement resetting module Rst_2T. The second clock signal input end of the second supplement resetting module Rst_2T is connected to the clock signal line CLK1, and the third control signal input end of the second supplement resetting module Rst_2T is configured to receive the signal dummy1. In the case that the effective signal dummy3 is outputted by the resetting shift register unit, this effective signal dummy3 may be received by the second control signal end of the first supplement resetting module Rst_3T. Hence, the first signal output end of the first supplement resetting module Rst_3T may be electrically connected to the predetermined level signal input end, so as to pull down the potential at the output resetting end of the corresponding resetting shift register unit to a predetermined level. At this time, the output pull-down transistor of the resetting shift register unit for outputting the signal dummy3 is turned off, and the pull-up node resetting end $R_{UP}$ of resetting shift register unit for outputting the signal dummy2 may not be coupled to a high level due to a parasitic capacitor. No leakage current may occur for the pull-up node PU of the resetting shift register unit for outputting the signal dummy2, so it is able to output the signal dummy2 in a stable manner. In addition, the signal dummy2 may be outputted to a pull-up node resetting end $R_{PU}$ of a display shift register unit for outputting a signal AA3 and an output resetting end $R_{out}$ of a display shift register unit for outputting a signal AA4. Due to the stable signal dummy2, it is able to reset a pull-up node of the display shift register unit for outputting the signal AA3 and an output end of the display shift register unit for outputting the signal AA4 in a better manner, thereby to output the signal AA3 and the signal AA4 in a stable manner.

The effective signal dummy1 may be maintained for a long time period, so within a time period where the effective signal dummy3 and the effective signal dummy1 overlap each other, the second supplement resetting module Rst_2T corresponding to the shift register unit for outputting the signal dummy3 may output a low level signal, so as to prevent the occurrence of the leakage current for the pull-up node that outputs the signal dummy3 at this time period, thereby to output the signal dummy3 in a stable manner.

The effective signal dummy3 is used to reset the output end of the display shift register unit for outputting the signal AA5 and the pull-up node of the display shift register for outputting the signal AA4, so through the stable signal dummy3, it is able to output the signal AA5 and the signal AA4 in a stable manner.

Similarly, the first signal output end of the first supplement resetting module Rst_3T corresponding to the resetting shift register unit for outputting the signal dummy2 is connected to the output resetting end $R_{out}$ of the resetting shift register unit for outputting the signal dummy2 and the pull-up node resetting end $R_{UP}$ of the resetting shift register unit for outputting the signal dummy1. In the case of outputting the effective signal dummy2, the first signal output end of the corresponding first supplement resetting module Rst_3T may output a low level signal, so as to turn off the pull-down transistor for outputting the signal dummy2, and the pull-up node resetting end of resetting shift register unit for outputting the signal dummy1 may not be coupled to a high level. No leakage current may occur for the pull-up node PU of the resetting shift register unit for outputting the signal dummy1, thereby to output the signal dummy1 in a stable manner. The signal dummy1 is used to reset the pull-up node of the display shift register unit for outputting the signal AA2 and the output end of the shift register unit for outputting the signal AA3, so it is able to output the signal AA2 and the signal AA3 in a stable manner.

The signal output end of the first supplement resetting module Rst_3T corresponding to the resetting shift register unit for outputting the signal dummy1 is connected to the output resetting end $R_{out}$ of the shift register unit for outputting the signal dummy1 and the pull-up node resetting end $R_{PU}$ of the shift register unit for outputting the signal AA5. In the case of outputting the effective signal dummy1, a low level signal is outputted by the first supplement resetting module Rst_3T to the output resetting end $R_{out}$ of the resetting shift register unit for outputting the signal dummy1. Hence, the output pull-down transistor of the resetting shift register unit for outputting the signal dummy1 may be turned off, so as not to couple the pull-up node resetting end $R_{PU}$ of the display shift register unit for outputting the signal AA5 to a high level, thereby to prevent the occurrence of the leakage current for the pull-up node of the display shift register unit for outputting the signal AA5 in the case of outputting the effective signal dummy1, and ensure the stability of the signal AA5.

As shown in FIG. 6, the eight shift register units are all resetting shift registers, which are configured to output a signal dummy1, a signal dummy2, a signal dummy3, a signal dummy4, a signal dummy5, a signal dummy6, a signal dummy7 and a signal dummy8 respectively. The three resetting shift register units for outputting the signal dummy6, the signal dummy7 and the signal dummy8 each correspond to one first supplement resetting module Rst_3T. A first signal output end of the first supplement resetting module Rst_3T corresponding to the resetting shift register unit for outputting the signal dummy6 is connected to an output resetting end $R_{out}$ of the resetting shift register unit for outputting the signal dummy6, and also to a pull-up resetting end $R_{PU}$ of the resetting shift register unit for outputting the signal dummy5. A first signal output end of the first supplement resetting module Rst_3T corresponding to the resetting shift register unit for outputting the signal dummy7 is connected to an output resetting end $R_{out}$ and a pull-up node resetting end $R_{PU}$ of the resetting shift register unit for outputting the signal dummy7. A first signal output end of the first supplement resetting module Rst_3T corresponding to the resetting shift register unit for outputting the signal dummy8 is connected to an output resetting end $R_{out}$ and a pull-up node resetting end $R_{PU}$ of the resetting shift register unit for outputting the signal dummy8.

As shown in FIG. 7, the eight shift register units are all resetting shift register units, which are configured to output a signal dummy1, a signal dummy2, a signal dummy3, a signal dummy4, a signal dummy5, a signal dummy6, a signal dummy7 and a signal dummy8 respectively. The three resetting shift register units for outputting the signal dummy6, the signal dummy7 and the signal dummy8 each correspond to one first supplement resetting module Rst_3T, and the resetting shift register unit for outputting the signal dummy8 further corresponds to one second supplement resetting module Rst_2T. A connection mode between the three first supplement resetting modules Rst_3T and the three corresponding shift register units and a connection mode between the second supplement resetting module Rst_2T and the corresponding shift register unit in FIG. 7 are identical to a connection mode between the three first supplement resetting module Rst_3T and the three corresponding shift register units and a connection mode between the second supplement resetting module Rst_2T and the corresponding shift register unit in FIG. 4, and thus will not be particularly defined herein.

As shown in FIG. 8, signals from the eight shift register units are not scanning signals for display. These eight shift register units output a signal dummy1, a signal dummy2, a signal dummy3, a signal dummy4, a signal dummy5, a signal dummy6, a signal dummy7 and a signal dummy8 respectively. The three shift register units for outputting the signal dummy6, the signal dummy7 and the signal dummy8 each correspond to one first supplement resetting module Rst_3T, and the shift register unit for outputting the signal dummy8 further corresponds to one second supplement resetting module Rst_2T. A connection mode between the three first supplement resetting modules Rst_3T and the corresponding three shift register units in FIG. 8 is identical to a connection mode between the three first supplement resetting modules Rst_3T and the corresponding three shift register units in FIG. 7, and thus will not be particularly defined herein. In FIG. 8, the pull-up node resetting end of the last-level shift register unit is reset through one third supplement resetting module Rst_3T'. A structure of the third supplement resetting module Rst_3T' is identical to a structure of the first supplement resetting mode Rst_3T, and the clock signals and the control signals applied to the first supplement resetting modules Rst_3T are different from clock signals and control signals applied to the third supplement resetting module Rst_3T'.

The present disclosure further provides in some embodiments a display device including the above-mentioned gate driver circuit.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A gate driver circuit, comprising multiple levels of shift register units and 2N clock signal lines, wherein
the shift register unit at each level comprises an output resetting end and a pull-up node resetting end;
the multiple levels of shift register units comprise display shift register units and resetting shift register units, and at least the shift register units at the latter N levels are the resetting shift register units, where N is a natural number greater than 0;
among at least the multiple levels of shift register units including the display shift register units and a first-level resetting shift register unit of the resetting shift register units at the latter N levels, an output resetting end of a current-level shift register unit is directly connected to a pull-up node resetting end of a previous-level shift register unit;
the gate driver circuit further comprises a first supplement resetting module, and at least the first-level resetting shift register unit of the resetting shift register units at the latter N levels corresponds to the first supplement resetting module;
the first supplement resetting module comprises a first pull-up control unit, a first pull-down control unit, a first clock signal input end, a predetermined level input end, a first control signal input end, a second control signal input end and a first signal output end;
a control end of the first pull-up control unit is connected to the first clock signal input end, an output end of the first pull-up control unit is connected to the first signal output end, and in the case of an effective signal is applied to the first clock signal input end, the first pull-up control unit is configured to enable the first clock signal input end to be electrically connected to the first signal output end;
a first control end of the first pull-down control unit is directly connected to the first control signal input end, a second control end of the first pull-down control unit is directly connected to the second control signal input end, an input end of the first pull-down control unit is connected to the predetermined level input end, an output end of the first pull-down control unit is connected to the first signal output end, and in the case that an effective signal is applied to any of the first control signal input end and the second control signal input end, the first pull-down control unit is configured to enable the predetermined level input end to be electrically connected to the first signal output end;
the first control signal input end of the first supplement resetting module is connected to an input end of the resetting shift register unit corresponding to the first supplement resetting module, the second control signal input end of the first supplement resetting module is connected to an output end of the resetting shift register unit corresponding to the first supplement resetting module, and the first signal output end of the first supplement resetting module is connected to an output resetting end of the resetting shift register unit corresponding to the first supplement resetting module; and
in the case that an effective signal is outputted from the resetting shift register unit corresponding to the first supplement resetting module, a clock signal from the first clock signal input end of the first supplement resetting module is an ineffective signal.

2. The gate driver circuit according to claim 1, wherein each of the resetting shift register units at the latter N levels corresponds to one first supplement resetting module.

3. The gate driver circuit according to claim 2, wherein among the resetting shift register units at the latter N levels, apart from a first-level resetting shift register unit, the signal output end of each first supplement resetting module corresponding to a current-level resetting shift register unit is further connected to the pull-up node resetting end of the current-level resetting shift register unit.

4. The gate driver circuit according to claim 2, further comprising a second supplement resetting module, wherein
a last-level resetting shift register unit corresponds to the second supplement resetting module;
the second supplement resetting module comprises a second clock signal input end, a second pull-up control transistor, a third pull-down control transistor, a third control signal input end and a second signal output end, the second signal output end is connected to a pull-up node resetting node of the corresponding shift register unit;
a gate electrode and a first electrode of the second pull-up control transistor are connected to the second clock signal input end, and a second electrode of the second pull-up control transistor is connected to the second signal output end;
a gate electrode of the third pull-down control transistor is connected to the third control signal input end, and in the case that the resetting shift register unit corresponding to the second supplement resetting module starts to output an effective signal, the third control signal input end is configured to receive the effective signal;
a first electrode of the third pull-down control transistor is connected to the second signal output end, and a second electrode of the third pull-down control transistor is connected to the predetermined level input end; and
for the first supplement resetting module and the second supplement resetting module corresponding to an identical resetting shift register unit, a clock signal from the second clock signal input end is staggered by a predetermined time period from a clock signal from the first clock signal input end, and the predetermined time period is smaller than a pulse width of an output signal from the shift register unit.

5. The gate driver circuit according to claim 2, wherein the signal output end of the first supplement resetting module is further connected to a pull-up node resetting end of a previous-level shift register unit of the resetting shift register unit corresponding to the first supplement resetting module.

6. The gate driver circuit according to claim 2, further comprising a third supplement resetting module, a structure of which is substantially identical to that of the first supplement resetting module, wherein
a clock signal from a first clock signal input end of the third supplement resetting module is staggered by a predetermined time period from a clock signal from a first clock signal input end of the first supplement resetting module, and the predetermined time period is smaller than a pulse width of an output signal from the shift register unit; and
in the case that the resetting shift register unit corresponding to the third supplement resetting module starts to output an effective signal, a first control signal input end of the third supplement resetting module is configured to receive the effective signal, and a second control signal input end of the third supplement resetting module is configured to receive a clock signal, a time sequence of the clock signal is complement to a time sequence of the clock signal from the first clock signal input end of the third supplement resetting module.

7. The gate driver circuit according to claim 3, further comprising a second supplement resetting module, wherein
a last-level resetting shift register unit corresponds to the second supplement resetting module;
the second supplement resetting module comprises a second clock signal input end, a second pull-up control transistor, a third pull-down control transistor, a third control signal input end and a second signal output end, the second signal output end is connected to a pull-up node resetting node of the corresponding shift register unit;
a gate electrode and a first electrode of the second pull-up control transistor are connected to the second clock signal input end, and a second electrode of the second pull-up control transistor is connected to the second signal output end;
a gate electrode of the third pull-down control transistor is connected to the third control signal input end, and in the case that the resetting shift register unit corresponding to the second supplement resetting module starts to output an effective signal, the third control signal input end is configured to receive the effective signal;
a first electrode of the third pull-down control transistor is connected to the second signal output end, and a second electrode of the third pull-down control transistor is connected to the predetermined level input end; and
for the first supplement resetting module and the second supplement resetting module corresponding to an identical resetting shift register unit, a clock signal from the second clock signal input end is staggered by a predetermined time period from a clock signal from the first clock signal input end, and the predetermined time period is smaller than a pulse width of an output signal from the shift register unit.

8. The gate driver circuit according to claim 3, wherein the signal output end of the first supplement resetting module is further connected to a pull-up node resetting end of a previous-level shift register unit of the resetting shift register unit corresponding to the first supplement resetting module.

9. The gate driver circuit according to claim 3, further comprising a third supplement resetting module, a structure of which is substantially identical to that of the first supplement resetting module, wherein
a clock signal from a first clock signal input end of the third supplement resetting module is staggered by a predetermined time period from a clock signal from a first clock signal input end of the first supplement resetting module, and the predetermined time period is smaller than a pulse width of an output signal from the shift register unit; and in the case that the resetting shift register unit corresponding to the third supplement resetting module starts to output an effective signal, a first control signal input end of the third supplement resetting module is configured to receive the effective signal, and a second control signal input end of the third supplement resetting module is configured to receive a clock signal, a time sequence of the clock signal is complement to a time sequence of the clock signal from the first clock signal input end of the third supplement resetting module.

10. The gate driver circuit according to claim 1, wherein the first pull-up control unit comprises a first pull-up control transistor, a gate electrode and a first electrode of the first pull-up control transistor are connected to the clock signal input end to form the control end of the first pull-up control unit, and a second electrode of the first pull-up control transistor forms the output end of the first pull-up control unit.

11. The gate driver circuit according to claim 1, wherein the first pull-down control unit comprises a first pull-down control transistor and a second pull-down control transistor, a gate electrode of the first pull-down control transistor is connected to the first control signal input end, a first electrode of the first pull-down control transistor is connected to the signal output end, and a second electrode of the first pull-down control transistor is connected to the predetermined level input end; and a gate electrode of the second pull-down control transistor is connected to the second control signal input end, a first electrode of the second pull-down control transistor is connected to the signal output end, and a second electrode of the second pull-down control transistor is connected to the predetermined level input end.

12. The gate driver circuit according to claim 11, wherein in the case that the first pull-up control unit comprises the first pull-up control transistor, a width-to-length ratio of the first pull-up control transistor is smaller than a width-to-length ratio of the first pull-down control transistor and smaller than a width-to-length ratio of the second pull-down control transistor.

13. The gate driver circuit according to claim 1, wherein the shift register unit comprises an output transistor, a first electrode of the output transistor is configured to receive a clock signal, and a second electrode of the output transistor is connected to an output end of the shift register unit, and a time sequence of the clock signal inputted to the first electrode of the output transistor corresponding to the shift register unit including the first supplement resetting module is complement to a time sequence of the clock signal inputted to the first supplement resetting module.

14. The gate driver circuit according to claim 1, wherein N is 3.

15. A display device comprising the gate driver circuit according to claim 1.

* * * * *